[12] United States Patent
Ghannouchi et al.

(10) Patent No.: US 6,275,105 B1
(45) Date of Patent: Aug. 14, 2001

(54) ADAPTIVE LINEARIZATION OF A FEEDFORWARD AMPLIFIER BY COMPLEX GAIN STABILIZATION OF THE ERROR AMPLIFIER

(75) Inventors: Fadhel M. Ghannouchi, Montréal; François Beauregard, La Prairie; Ammar B. Kouki, Montréal; Marco Bouchard, Sainte-Catherine, all of (CA)

(73) Assignee: Amplix, Montreal (CA)

( * ) Notice: Subject to any disclaimer, the term of this patent is extended or adjusted under 35 U.S.C. 154(b) by 0 days.

(21) Appl. No.: 09/498,863

(22) Filed: Feb. 7, 2000

(51) Int. Cl.[7] .................................................. H03F 1/00
(52) U.S. Cl. ........................................ 330/151; 330/149
(58) Field of Search ..................................... 330/149, 151

(56) References Cited

U.S. PATENT DOCUMENTS

| | | |
|---|---|---|
| 4,130,807 | 12/1978 | Hall et al. . |
| 4,348,642 | 9/1982 | Harrington . |
| 4,389,618 | * 6/1983 | Bauman ............................... 330/149 |
| 4,394,624 | * 7/1983 | Bauman ............................... 330/151 |
| 5,077,532 | 12/1991 | Obermann et al. . |
| 5,157,345 | 10/1992 | Kenington et al. . |
| 5,166,634 | 11/1992 | Narahashi et al. . |
| 5,327,096 | 7/1994 | Sakamoto et al. . |
| 5,386,198 | 1/1995 | Ripstrand et al. . |
| 5,485,120 | * 1/1996 | Anvari ................................. 330/151 |
| 5,489,875 | * 2/1996 | Cavers ................................ 330/151 |
| 5,508,657 | 4/1996 | Behan . |
| 5,789,976 | 8/1998 | Ghannouchi et al. . |
| 6,133,791 | * 10/2000 | Horiguchi et al. .................... 330/151 |

OTHER PUBLICATIONS

Ashokar K. Talwar; "*Reduction of Noise and Distortion in Amplifiers Using Adaptive Cancellation*"; IEEE Transactions on Microwave Theory and Techniques, Jun. 1994, vol. 42, No. 6, pp. 1086–1087.

H. Seidel; "*A Microwave Feed–Forward Experiment*"; The Bell System Technical Journal, Nov. 1971, vol. 50, No. 9, pp. 2879–2916.

Robert G. Meyer, Ralph Eschenbach, and Walter M. Edgerley, Jr.; "*A Wide–Band Feedforward Amplifier*"; Dec. 1974, vol. SC–9, No. 6, pp. 422–428.

Peter B. Kenington and David W. Bennett; "*Linear Distortion Correction Using a Feedforward System*"; IEEE Transactions On Vehicular Technology, Feb. 1996, vol. 45, No. 1, pp. 74–79.

K.J. Parsons and P.B. Kenington; "*The Efficiency of a Feedforward Amplifier with Delay Loss*"; IEEE Transactions On Vehicular Technology, May 1994, vol. 43, No. 2, pp. 407–412.

K. Konstantinou and D.K. Paul; "Analysis and Design of Broadband, High Efficiency Feedforward Amplifiers"; IEEE MTT–S Digest, Jun. 1996, WE3F–15, pp. 867–870.

(List continued on next page.)

*Primary Examiner*—Benny Lee
*Assistant Examiner*—Henry Choe
(74) *Attorney, Agent, or Firm*—Altera Law Group, LLC

(57) ABSTRACT

In a feedforward amplifier for amplifying an input signal in order to produce an amplified output signal, an error signal representative of distortion in the amplified output signal is produced and an adaptive linearization circuit is provided. In this adaptive linearization circuit, serially interconnected attenuator, phase shifter and error amplifier process the error signal to produce a feature-adjusted error signal. A coupling member combines the feature-adjusted error signal in the amplified output signal in order to cancel distortion in this amplified output signal, and a comparator/controller circuit is responsive to the error signal and the feature-adjusted error signal to control the attenuator and the phase shifter.

34 Claims, 4 Drawing Sheets-

OTHER PUBLICATIONS

Shoichi Narahashi and Toshio Nojima; *"Extremely Low–Distortion Multi–Carrier Amplifier—Self–Adjusting Feed–Forward (SAFF) Amplifier"*; IEEE, 1991, 46.5.1–6, pp. 1485–1490.

T.J. Bennett and R.F. Clements; *"Feedforward–an alternative approach to amplifier linearization"*, May 1974, vol. 44, No. 5, pp. 257–262.

S. Kumar and G. Wells; *"Memory controlled feedforward lineariser suitable for MMIC implementation"*, Feb. 1991, vol. 138, No. 1.

James K. Cavers; *"Adaption Behavior of a Feedforward Amplifier Linearizer"*, IEEE Transactions On Vehicular Technology, 1995, vol. 44.

R.D. Stewart and F.F. Tusubira; *"Predistortion Linearisation of Amplifiers For UHF Mobile Radio"*.

V. Steel, D. Scott and Ludvik; *"A 6–18 GHZ, High Dynamic Range MMIC Amplifier Using A Feedforward Technique"*, IEEE MTT–S Digest, 1990, pp. 911–914.

Mauro de Lima Coimbra and Rui Fragassi Souza; *"Improvements In Broadband Feed–Forward Amplifiers"*, Microwave and Optical Technology Letters, Jul. 1996, vol. 12, No. 4, pp. 213–215.

Sang–Gee Kang, II–Kyoo Lee, and Ki–Suk Yoo; *"Analysis and Design of Feedforward Power Amplifier"*, IEEE MTT–S Digest, 1997, pp. 1519–1522.

Eid E. Eid, Fadhel M. Ghannouchi and Francois Beauregard; *"Optimal Feedforward Linearization System Design"*, Microwave Journal, Nov. 1995, pp. 78–86.

* cited by examiner

ADAPTIVE LINEARIZATION OF A FEEDFORWARD AMPLIFIER BY COMPLEX GAIN STABILIZATION OF THE ERROR AMPLIFIER

BACKGROUND OF THE INVENTION

1. Field of the Invention

The present invention relates to feedforward power amplifiers, and more specifically to a method and circuit for conducting adaptive linearization of power amplifiers.

2. Brief Description of the Prior Art

RF power amplifiers are used in a wide variety of communications and other electronic applications. These amplifiers are made of one or more cascaded amplifier stages, each of which increases the level of the signal applied to the input of that stage by an amount known as the stage gain. Ideally, the input-to-output transfer of each stage is linear; that is, a perfect replica of the input signal increased in amplitude appears at the amplifier output. In reality, however, all RF amplifiers have a degree of non-linearity in their transfer characteristics. This non-linearity results in a distortion of the output signal so that it is no longer a perfect replica of the input. This distortion produces spurious signal components known as intermodulation products. Intermodulation products are undesirable because they cause interference, cross-talk and other deleterious effects on the performance of a system employing RF power amplifiers. Accordingly, the prior art reflects various methods and devices designed to reduce the distortion produced by RF power amplification.

Three methods have commonly been used in the prior art to reduce distortion: predistortion, feedback and feedforward. The main advantages of the feedforward approach over the two others methods are an unconditional stability over large frequency bandwidths without inherent frequency limitations, and a high degree of distortion cancellation irrespective of the order of the intermodulation products.

With the rapid development of satellites, mobiles, cellular radios and PCS communication systems, a common broadband power amplifier for a multi-channel usage is eagerly desired. This demand is stimulating continuous investigation of the feedforward linearization technique.

OBJECTS OF THE INVENTION

An object of the present invention is therefore to further improve performance of an adaptive feedforward amplifier through the use of the feedforward linearization technique.

SUMMARY OF THE INVENTION

More specifically, in accordance with the present invention, there is provided a method for adaptively linearizing a feedforward amplifier which, in operation, supplies an amplified output signal on a feedforward amplifier output and produces an error signal representative of distortion in the amplified output signal. This adaptive linearization method comprises controllably adjusting at least one feature of the error signal, and controlling the error signal feature adjusting in relation to the error signal and the feature-adjusted error signal. In this manner, the feature-adjusted error signal, when combined with the amplified output signal, substantially cancels distortion in the amplified output signal.

In accordance with preferred embodiments of the method of the invention:

the method further comprises combining the feature-adjusted error signal and the amplified output signal;

the error signal feature adjusting comprises: attenuating an amplitude of the error signal; shifting a phase of the error signal; and amplifying the amplitude-attenuated and phase-shifted error signal and producing a corresponding amplified error signal constituting the feature-adjusted error signal;

controlling of the error signal feature adjusting comprises: comparing the error signal and the feature-adjusted error signal and producing a corresponding output comparison signal; and controlling the error signal feature adjusting in response to the output comparison signal;

controlling of the error signal feature adjusting comprises: combining the error signal and the amplified error signal 180° out of phase with respect to each other and producing a corresponding output combination signal; detecting the power level of the output combination signal and producing a corresponding output power level signal; and controlling the error signal amplitude attenuating and the error signal phase shifting and thereby adjusting the amplitude and phase of the error signal in view of minimizing the output power level signal; and controlling of the error signal feature adjusting comprises: comparing waveforms of the error signal and the amplified error signal and producing an output waveform comparison signal; and controlling the error signal amplitude attenuating and the error signal phase shifting and thereby adjusting the amplitude and phase of the error signal in view of keeping a complex ratio between the error signal and the amplified error signal substantially constant.

The present invention also relates to an adaptive linearization circuit for a feedforward power amplifier which, in operation, supplies an amplified output signal on a feedforward amplifier output and produces an error signal representative of distortion in the amplified output signal. This adaptive linearization circuit comprises:

a controllable signal feature-adjusting circuit responsive to the error signal for producing a feature-adjusted error signal; and a comparator/controller circuit for comparing the error signal and the feature-adjusted error signal, and for controlling the signal feature-adjusting circuit in relation to the comparison between the error signal and the feature-adjusted error signal.

In operation, the controllable signal feature-adjusting circuit supplies a feature-adjusted error signal which, when combined with the amplified output signal, substantially cancels distortion in the amplified output signal.

The present invention further relates to an adaptive linearization circuit for a feedforward power amplifier which, in operation, supplies an amplified output signal on a feedforward amplifier output and produces an error signal representative of distortion in the amplified output signal. This adaptive linearization circuit comprises:

a controllable signal feature-adjusting circuit having an input responsive to the error signal and a feature-adjusted error signal delivering output; and a comparator/controller circuit having a first input responsive to the error signal, a second input responsive to the feature-adjusted error signal, and a control output connected to the controllable signal feature adjusting circuit so that, in operation, the signal feature-adjusting circuit is controlled in relation to a comparison between the error signal and the feature-adjusted error signal.

In operation, the controllable signal feature-adjusting circuit supplies a feature-adjusted error signal which, when combined with the amplified output signal, substantially cancels distortion in the amplified output signal.

Further in accordance with the present invention, there is provided a feedforward amplifier for amplifying an input signal in order to produce an amplified output signal, comprising:

- a main amplifier circuit responsive to the input signal for producing the amplified output signal supplied on a feedforward amplifier output;
- a signal comparator circuit responsive to the input signal and the amplified output signal for comparing the input signal and the amplified output signal and, as a result of this comparison, supplying an error signal representative of distortion in the amplified output signal;
- an adaptive linearization circuit comprising: a controllable signal feature-adjusting circuit responsive to the error signal for producing a feature-adjusted error signal; and a comparator/controller circuit for comparing the error signal and the feature-adjusted error signal, and for controlling the signal feature-adjusting circuit in relation to the comparison between the error signal and the feature-adjusted error signal; and
- a coupling member for transmitting the feature-adjusted error signal to the feedforward amplifier output in order to combine the feature-adjusted error signal and the amplified output signal in order to substantially cancel distortion in the amplified output signal.

Still further in accordance with the present invention, there is provided a feedforward amplifier for amplifying an input signal in order to produce an amplified signal, comprising:

- a main amplifier circuit having an input responsive to the input signal and an amplified signal delivering output connected to feedforward amplifier output;
- a signal-comparing circuit having a first input responsive to the input signal, a second input responsive to the amplified signal on the output of the main amplifier circuit, and an error signal delivering output, the error signal being representative of a comparison between the input signal and the amplified signal and of distortion in the amplified signal;
- an adaptive linearization circuit comprising: a controllable signal feature-adjusting circuit having an input responsive to the error signal and a feature-adjusted error signal delivering output; and a comparator/controller circuit having a first input responsive to he error signal, a second input responsive to the feature-adjusted error signal, and a control output connected to the controllable signal feature-adjusting circuit so that, in operation, the signal feature-adjusting circuit is controlled in relation to a comparison between the error signal and the feature-adjusted error signal; and
- a coupling member between the output of the signal feature-adjusting circuit and the feedforward amplifier output, wherein, in operation, the coupling member combines the feature-adjusted error signal with the amplified signal in order to substantially cancel distortion in the amplified output signal.

In accordance with a first preferred embodiment, the comparator/controller circuit comprises:

- a signal comparator sub-circuit having the first input responsive to the error signal, the second input responsive to the feature-adjusted error signal, and a comparison representative signal delivering output, wherein the comparison representative signal is representative of a comparison between the error signal and the feature-adjusted error signal; and
- a controller of the signal feature-adjusting circuit responsive to the comparison representative signal.

According to a second preferred embodiment:

the signal-comparing circuit comprises a 180° out of phase input signal and amplified signal combiner having a first input coupled to the input signal, a second input coupled to the amplified signal, and an error signal delivering output, wherein, in operation, the combiner combines the input signal and amplified signal 180° out of phase with respect to each other and thereby produces the error signal; and a delay circuit is connected to the first input of the combiner, wherein, in operation, the input signal is transmitted to the first input of the combiner through the delay circuit to compensate for a time of propagation of the input signal through the main amplifier circuit.

According to a further preferred embodiment:

the signal feature-adjusting circuit comprises:

- a controllable amplitude and phase modulator including: an amplitude attenuator to adjust an amplitude of the error signal; and a phase shifter to adjust a phase of the error signal; and
- an error amplifier responsive to the amplitude and phase adjusted error signal, wherein, in operation, the error amplifier amplifies the amplitude and phase adjusted error signal and thereby produces an amplified error signal constituting said feature-adjusted error signal; and the comparator/controller circuit comprises:

- a signal comparator sub-circuit having the first input responsive to the error signal, the second input responsive to the feature-adjusted error signal, and a comparison representative signal delivering output, wherein the comparison representative signal is representative of a comparison between the error signal and the feature-adjusted error signal; and
- a controller responsive to the output comparison signal and having a control output connected to the signal feature-adjusting circuit;

a time of propagation of the error signal through the controllable amplitude and phase modulator and the error amplifier varies non-linearly with a condition of operation, for example temperature, of the feedforward amplifier; and the feedforward amplifier further comprises:

- a first delay circuit through which, in operation, the error signal is transmitted to the first input of the signal comparator sub-circuit to compensate for a time of propagation of the error signal through the controllable amplitude and phase modulator and the error amplifier; and
- a second delay circuit between the output of the main amplifier circuit and the coupling member, wherein, in operation, the amplified signal is transmitted from the output of the main amplifier circuit to the coupling member to compensate a time of propagation of the error signal through a signal loop comprising the signal-comparing circuit, the controllable signal feature-adjusting circuit and the coupling member;

wherein the respective delays induced by the first and second delay circuits are substantially equal resulting in independence of the adaptive linearization circuit from the non-linear variation.

In a fourth preferred embodiment:
the signal feature-adjusting circuit comprises:
  a controllable amplitude and phase modulator which, in operation, adjusts an amplitude and a phase of the error signal; and
  an error amplifier responsive to the amplitude and phase adjusted error signal and having an amplified error signal delivering output, wherein in operation, the error amplifier amplifies the amplitude and phase adjusted error signal and thereby produces the amplified error signal, the amplified error signal constituting the feature-adjusted error signal; and
the comparator/controller circuit comprises:
  a 180° out of phase error signal and amplified error signal combiner having a first input coupled to the error signal, a second input coupled to the amplified error signal, and a combination signal delivering output, wherein, in operation, the combiner combines the error signal and the amplified error signal 180° out of phase with respect to each other and thereby produces the combination signal;
  a power detector responsive to the combination signal from the combiner, and having a combination signal power level delivering output; and
  a controller of the amplitude and phase modulator, including a combination signal power level minimizing algorithm responsive to the power level from the output of the power detector; and
a delay circuit is connected to the first input of the combiner, wherein in operation, the error signal is transmitted to the first input of the combiner through the delay circuit to compensate for a time of propagation of the error signal through the controllable amplitude and phase modulator and the error amplifier.

According to a fifth preferred embodiment:
the comparator/controller circuit comprises:
  a waveform comparing receiver having a first input coupled to the error signal, a second input coupled to the amplified error signal, and a waveform comparison signal delivering output, the waveform comparison signal being representative of a comparison between a waveform of the error signal and a waveform of the amplified error signal; and
  a controller of the amplitude and phase modulator, including an algorithm of control of the amplitude and phase modulator and of the corresponding adjustment of the amplitude and phase of the error signal, the algorithm being responsive to the waveform comparison signal and structured to keep substantially constant a complex ratio between the error signal on the first input of the waveform comparing receiver and the amplified error signal on the second input of the waveform comparing receiver; and
a delay circuit is connected to the first input of the waveform comparing receiver, wherein in operation, the error signal is transmitted to the first input of the waveform comparing receiver through the delay circuit to compensate for a time of propagation of the error signal through the controllable amplitude and phase modulator and the error amplifier.

The objects, advantages and other features of the present invention will become more apparent upon reading of the following non restrictive description of preferred embodiments thereof, given by way of example only with reference to the accompanying drawings.

BRIEF DESCRIPTION OF THE DRAWINGS

In the appended drawings.

DETAILED DESCRIPTION OF THE PREFERRED EMBODIMENTS

Figure 1:
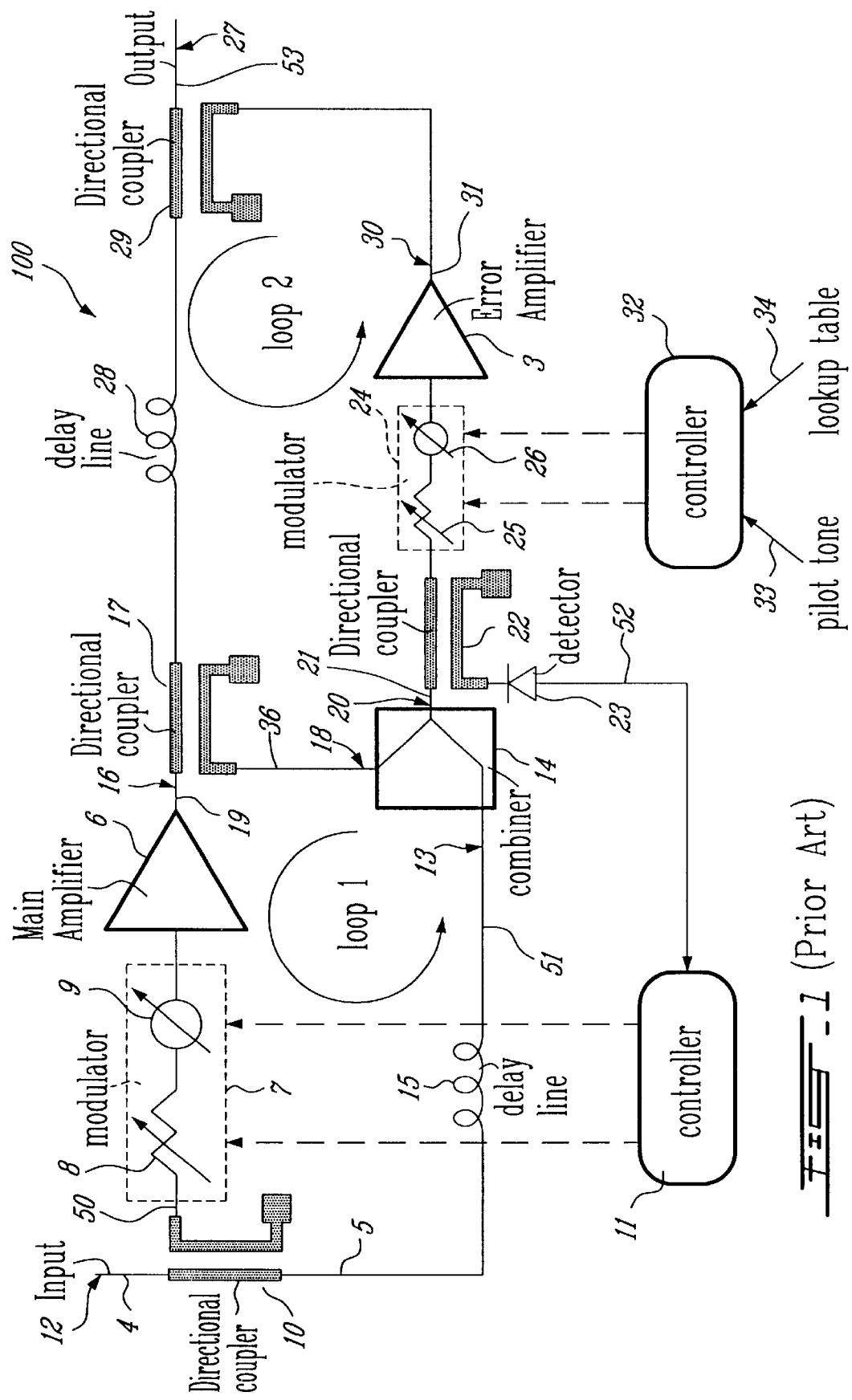
FIG. 1 is a block diagram of a prior art feedforward amplifier.
Figure 2:
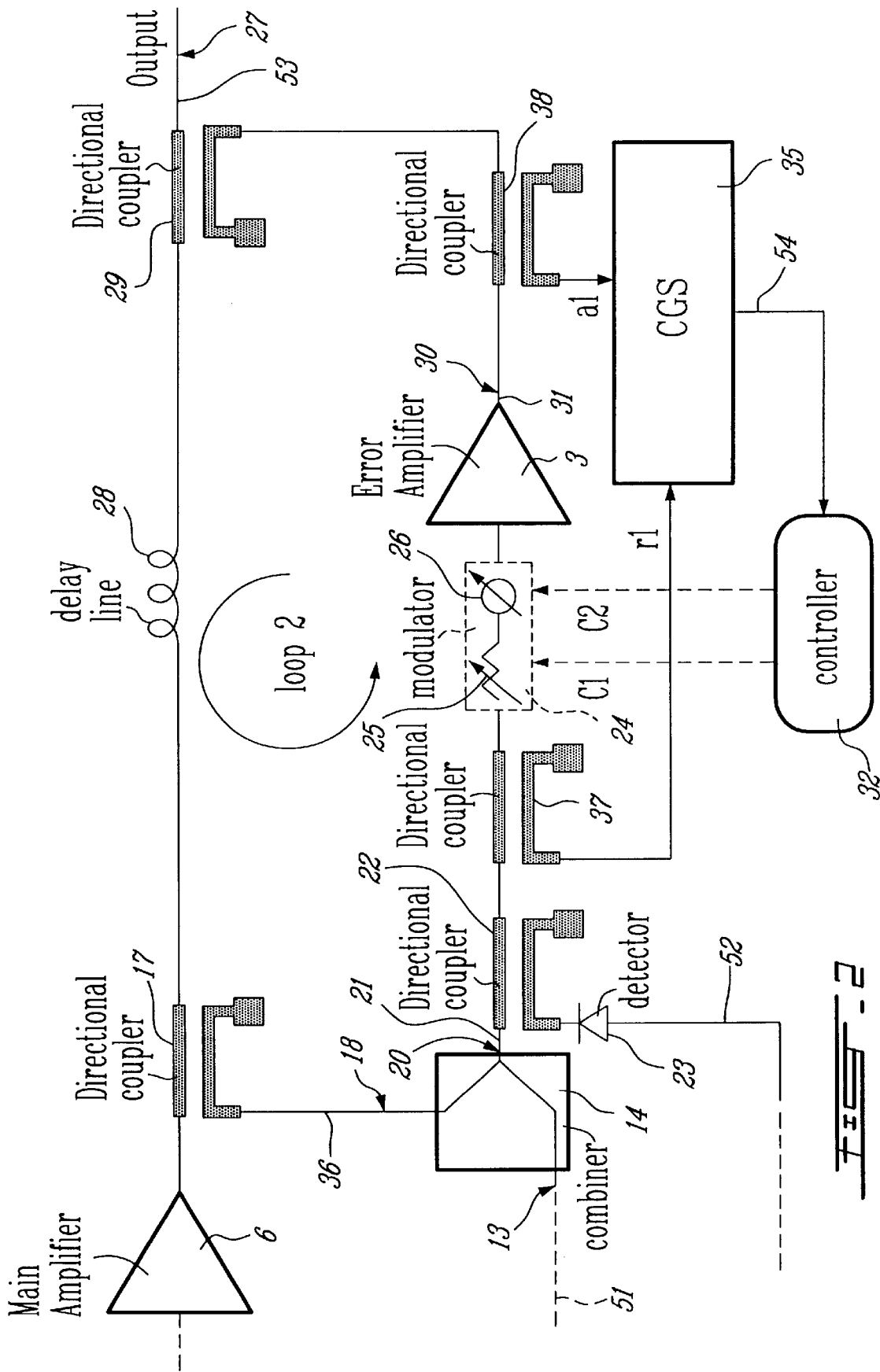
FIG. 2 is a block diagram of a feedforward amplifier comprising, according to a preferred embodiment of the present invention, a complex gain stabilization circuit.

The prior art feedforward amplifier of FIG. 1 is generally identified by the reference 100. According to a preferred embodiment of the present invention as illustrated in FIG. 2, adaptive linearization of the feedforward amplifier 100 is conducted through complex gain stabilization of error amplifier 3. Error amplifier 3 is also known as a auxiliary amplifier. As explained in the following description, this linearization technique makes use of two signal cancellation loops, i.e. loops 1 and 2 of the appended drawings.

The function of loop 1 (FIG. 1) is to isolate an error signal representative of distortion in the amplified output signal 19 on the output 16 of main amplifier 6 by subtracting a reference signal (non-distorted signal from the input 12 of the feedforward amplifier 100) from the amplified distorted output signal 19.

More specifically, in loop 1 of FIG. 1, a sample 50 of an input signal 4 is supplied to the main amplifier 6 from input 12 through a directional coupler 10 and a modulator 7. Main amplifier 6 amplifies non-distorted signal 50 to produce a distorted amplified signal 19 on its output 16. As well known to those of ordinary skill in the art, main amplifier 6 causes, under certain circumstances, distortion of the non-distorted signal 50. Modulator 7 includes a variable attenuator 8 for adjusting the amplitude of the signal 50 and a variable phase shifter 9 for adjusting the phase of the same signal 50. The variable attenuator 8 and the variable phase shifter 9 are both controlled through a controller 11.

A second non-distorted sample 5 of the input signal 4 is supplied to a first input 13 (see non-distorted signal 51) of a combiner 14 through a delay line 15. A sample 36 of the amplified distorted signal 19 on the output 16 of the main amplifier 6 is supplied to a second input 18 of the combiner 14. Signal 36 is therefore a distorted signal supplied to the second input 18 of the combiner 14.

To produce a delay equalized signal 51 applied to the input 13 of combiner 14, signal sample 5 is delayed by delay line 15 by a time period corresponding substantially to the time of propagation of signal 4 from the input 12 of the feedforward amplifier 100 to the input 18 of the combiner 14 through the directional coupler 10, the modulator 7, the main amplifier 6 and the directional coupler 17. In this manner, any phase shift between the signals 36 and 51 caused by different times of propagation of these two signals 36 and 51 toward the combiner 14 is eliminated. The non-distorted signal 51 on the input 13 of the combiner 14 constitutes a reference signal representative of the signal 4 on the input 12 of the feedforward amplifier 100.

The directional couplers 10 and 17 as well as the delay line 15 are selected and/or adjusted to appropriately balance the phases and amplitudes of signals 51 and 36 on the respective inputs 13 and 18 of the combiner 14.

Combiner 14 subtracts the non-distorted signal 51 from distorted signal 36 to produce, on the output 20 of the combiner 14, the error signal 21 representative of distortion in the amplified signal 19. Error signal 21 is sampled through a directional coupler 22 and the power level of this sampled error signal is detected through diode detector 23 to supply a power level output signal 52 supplied to the controller 11. In response to the power level output signal 52, the controller 11 will adjust the attenuator 8 and the phase shifter 9 to reduce, as much as possible, the amplitude of the power level output signal 52 and therefore the amplitude of the error signal 21. Operation of the controller 11 to adjust the attenuator 8 and the phase shifter 9 are believed to be well known to those of ordinary skill in the art and, accordingly, will not be further described in the present specification.

In loop 2, the error signal 21 is supplied to the error amplifier 3 through a modulator 24. Again, modulator 24 comprises a variable attenuator 25 and a variable phase shifter 26 adjusted by means of a controller 32. The output 16 of the main amplifier 6 is connected to the feedforward amplifier output 27 of the feedforward power amplifier 100 through a delay line 28 and a directional coupler 29. Finally, the output 30 of the error amplifier 3 is also connected to the feedforward amplifier output 27 of the feedforward power amplifier 100 through the directional coupler 29.

The error signal 21 from the combiner 14 is attenuated by the variable attenuator 25, is phase shifted by the variable phase shifter 26, and is then amplified by the error amplifier 3. Finally, the amplified error signal 31 on the output 30 of the error amplifier 3 is combined 180° out of phase and with equal magnitude on the feedforward amplifier output 27 through the directional coupler 29 to thereby eliminate distortion from the amplified distorted signal 53 on the output 27 of the feedforward power amplifier 100. The function of the delay line 28 is to delay the amplified signal 19 from the output 16 of the main amplifier 6 by a time period corresponding to the time of propagation of the signal 19 through directional coupler 17, combiner 14, directional coupler 22, attenuator 25, phase shifter 26, error amplifier 3 and directional coupler 29.

While adaptive control of loop 1 is fairly well mastered mainly because of the absence of nonlinear devices in the reference branch (directional coupler 10 and delay line 15), adaptive control of the loop 2, which is critical to the overall adaptive linearization of the feedforward power amplifier 100, is much more difficult to achieve. To date, the most common solutions used to implement adaptive control of loop 2 have been limited to the use of pilot tones (pilot tone 33) and/or temperature dependent lock-up tables (lock-up table 34) as schematically illustrated in FIG. 1. A controller 32 is responsive to such a pilot tone 33 and/or lock-up table 34 to adjust the variable attenuator 25 and phase shifter 26.

To insure good linearity of the overall feedforward power amplifier 100, both loops 1 and 2 must be balanced and adaptively tuned. Assuming that loop 1 is fairly tuned at all times, the problem is then to balance loop 2 and maintain it tuned adaptively. Described hereinafter are examples of preferred embodiments of circuits for carrying out this task.

CGS (Complex Gain Stabilization) Circuit:

Referring to FIG. 2 of the appended drawings, it is clear that the direct output stage of loop 2, which is composed of directional coupler 17, delay line 28, and directional coupler 29, is a purely passive circuit. Therefore, its complex gain is constant except for a possible slight variation with temperature. Temperature variation of the complex gain is compensated by equalization of its delay lines. This aspect of the invention will be discussed in detail below.

To maintain loop 2 balanced and tuned, the amplitude and phase of the complex gain of the error amplifier branch (attenuator 25, phase shifter 26, and error amplifier 3) must remain constant, independently of the various operating conditions of this distortion amplifier branch. For that purpose, a CGS circuit 35 is used.

As illustrated in FIG. 2, the CGS circuit 35 is responsive to both:
the error signal 21 from the output 20 of the combiner 14 just before it is supplied to the variable attenuator 25 through a directional coupler 37; and
the amplified error signal 31 from the error amplifier output 30 through a directional coupler 38;
to provide the controller 32 with a control criterion 54 suitable for producing control signals C1 and C2 adequate to adjust the variable attenuator 25 and phase shifter 26, respectively.

Since the directional coupler 17, combiner 14, and directional coupler 22 are all passive components, the CGS circuit 35 is connected to the input and output of the modulator 24/error amplifier 3 chain since the attenuator 25, phase shifter 26 and error amplifier 3 are the only elements with active components that may exhibit complex gain variation.

Prior to normal operation of the circuit of FIG. 2, the adaptive linearization circuit comprising loop 2 and the CGS loop must be balanced (tuned). The following steps describe the tuning procedure. First, loop 2 is tuned by setting the values for the non-variable components in loop 2 such as couplers 17, 29, 22, 37 and 38 and delay line 28 and the values for control signals C1 and C2 such that the signals being combined are 180° out of phase and have equal amplitudes. Second, while keeping control signals C1 and C2 fixed, the CGS loop is tuned. Tuning of the CGS loop involves setting the values for tuning constant k or complex ratio a1/r1 depending on the preferred embodiment (see FIGS. 3 and 4 discussed below). During normal operation of the circuit of FIG. 2 (i.e., the preferred embodiments of FIGS. 3 and 4), tuning constant k or complex ratio a1/r1 are kept constant while control signals C1 and C2 are variable.

The CGS circuit 35 of FIG. 2 can be implemented in many different ways. Two examples will be given in the following description.

Figure 3:
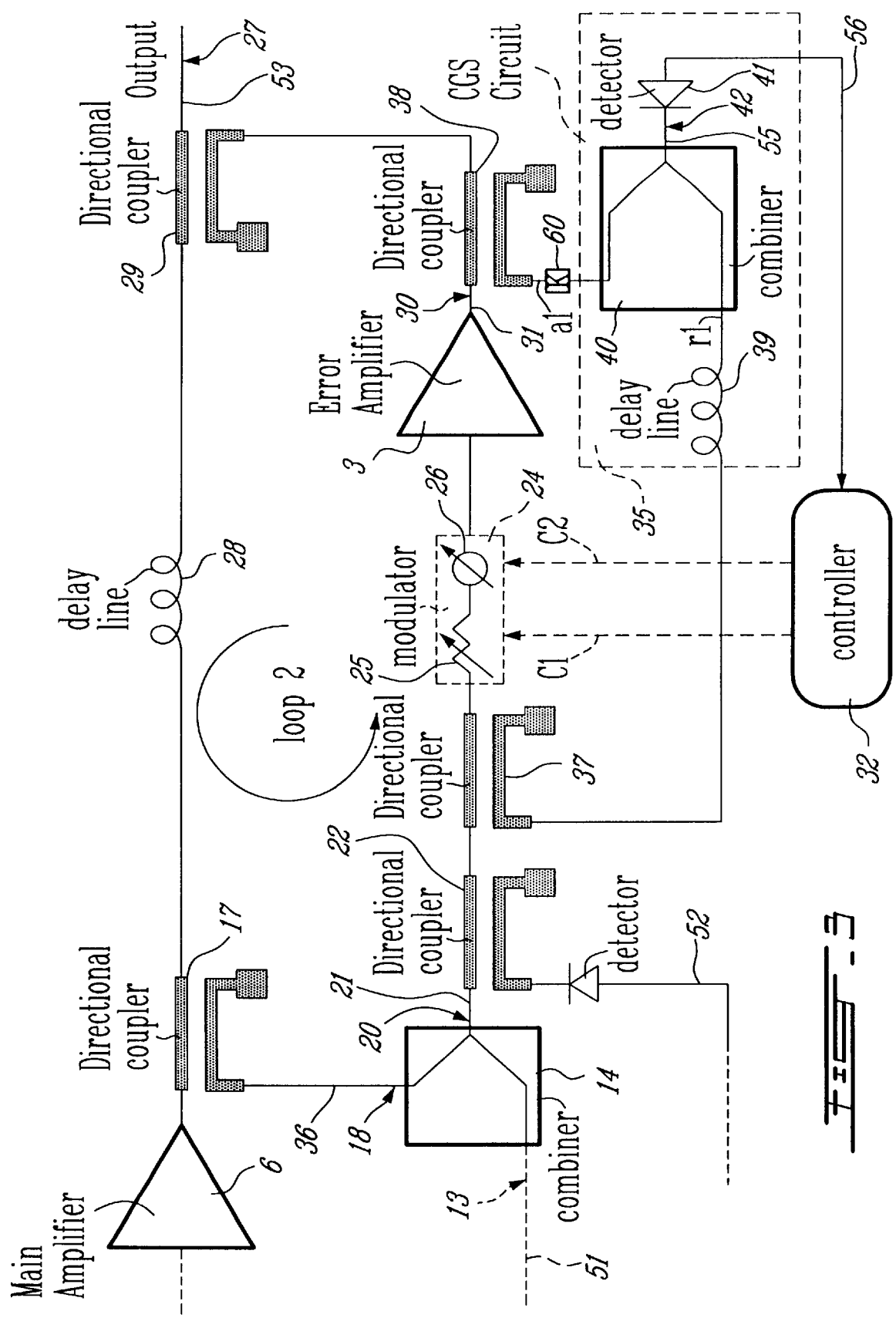
FIG. 3 is a block diagram of the feedforward amplifier of FIG. 2, showing a first preferred embodiment of the complex gain stabilization circuit.

(a) Implementation of the CGS Circuit Using the Power Minimization Method:

This first example of implementation of the CGS circuit 35 is given in FIG. 3. This version of the CGS circuit operates as follows.

The error signal 21 supplied to the modulator 24 is sampled by means of the directional coupler 37. This sampled error signal constitutes a reference signal and is referred to as r1. In the same manner, the amplified error signal 31 on the output 30 of the error amplifier 3 is sampled through the directional coupler 38. This sampled amplified error signal is referred to as a1. The directional couplers 37 and 38 are so scaled that signals r1 and a1 are in the same power range. Signal a1 is multiplied by a complex constant k in box 60 such that signals r1 and a1 are nominally of equal amplitudes and 180° out of phase. The directional couplers 37 and 38 as well as the delay line 39 are selected and/or adjusted to appropriately balance the phases and amplitudes of the two signals r1 and a1 on the respective inputs of the combiner 40.

The reference signal r1 from the directional coupler 37 is delayed by means of delay line 39 to compensate for the time of propagation of the error signal 21 through the modulator 24, the error amplifier 3 and the directional coupler 38. The propagation-time-compensated reference signal r1 is then combined 180° out of phase with the signal a1 multiplied by k by means of the combiner 40. Power of the resulting combined signal 55 at the output 42 of the combiner 40 is detected by a diode detector 41 whose output (comparison signal 56) is supplied to the controller 32. The controller 32 is responsive to the power level (comparison signal 56) of the signal 55 to adjust the attenuator 25 and the phase shifter 26. More specifically, the controller 32 uses a minimizing algorithm to generate a control signal C1 for adjusting the variable attenuator 25 and a control signal C2 for adjusting the phase shifter 26. This minimizing algorithm generates control signals C1 and C2 which adjust the attenuator 25 and the phase shifter 26 to values which minimize signal 56, i.e. the power level detected through the diode detector 41. Those of ordinary skill in the art know that such an algorithm takes into consideration the configuration of the circuit of loop 2 and the feedforward power amplifier 100 in general, the nature and characteristics of the components forming this circuit, etc. It will also appear to those of ordinary skill in the art that many different algorithms can possibly be implemented for that purpose. Moreover, some standard algorithms suitable to fulfill this function are available from the open literature.

Figure 4:
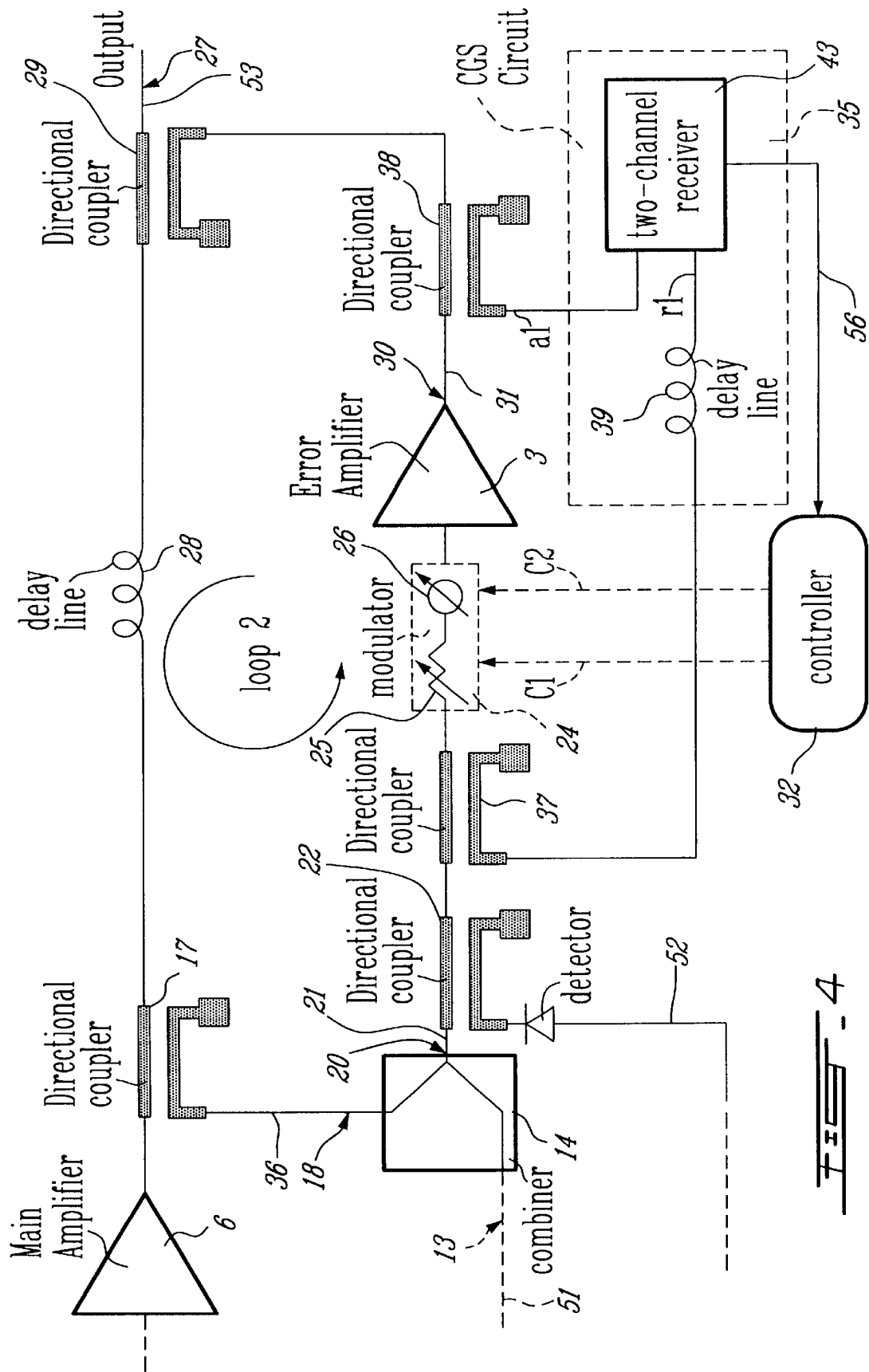
FIG. 4 is a block diagram of the feedforward amplifier of FIG. 2, showing a second preferred embodiment of the complex gain stabilization circuit.

(b) Implementation of the CGS Circuit Via the Two-channel Receiver Method:

A second possible implementation of the CGS circuit 35 of FIG. 2 in the feedforward power amplifier 100 is illustrated in FIG. 4. This second version of the CGS circuit 35 operates as follows.

The error signal 21 supplied to the modulator 24 is sampled by means of the directional coupler 37. This sampled error signal constitutes a reference signal and is referred to as r1.

The amplified error signal 31 on the output 30 of the distortion amplifier 3 is sampled by means of the directional coupler 38. This sampled amplified error signal is referred to as a1.

The reference signal r1 from the directional coupler 37 is delayed by means of the delay line 39 to compensate for the time of propagation of the error signal 21 through the modulator 24, the error amplifier 3 and the directional coupler 38.

To ensure proper balance of the signals a1 and r1 of loop 2, the complex ratio a1/r1 must be kept constant. To measure this complex ratio, a two-channel receiver 43 is used.

The two-channel receiver 43 may be implemented as a RF (Radio Frequency) unit working at RF frequencies. More specifically, receiver 43 comprises a processor circuit (not shown) for comparing the waveform of signal r1 with the waveform of signal a1 and for producing a comparision signal 56 representative of the difference between the two waveforms. Preferably, the processor circuit is a digital processor circuit and works on the signals r1 and a1 after analog-to-digital conversion thereof. However, analog processing of the signals r1 and a1 could also be implemented.

Receiver 43 may further comprises two frequency converters for down shifting the frequency of the two signals r1 and a1, respectively. This will allow a DSP (Digital Signal Processor) to perform FFT (Fast Fourier Transform) analysis of the two signals r1 and a1. The processor circuit (not shown) then works in the frequency domain to compare the waveform of signal r1 with the waveform of signal a1 in view of producing comparision signal 56.

It is believed to be otherwise within the knowledge of those of ordinary skill in the art to conceive a suitable two-channel receiver and, accordingly, this two-channel receiver 43 will not be further described in the present specification.

The controller 32 is then responsive to the comparison signal 56 to adjust the attenuator 25 and the phase shifter 26. More specifically, the controller 32 uses an algorithm to generate a control signal C1 for adjusting the variable attenuator 25 and a control signal C2 for adjusting the phase shifter 26. This algorithm generates control signals C1 and C2 which adjust the attenuator 25 and the phase shifter 26 to values which keep the complex ratio a1/r1 constant. Those of ordinary skill in the art know that such an algorithm takes into consideration the configuration of the circuit of loop 2 and the feedforward power amplifier 100 in general, the nature and characteristics of the components forming this circuit, etc. It will also appear to those of ordinary skill in the art that many different algorithms can possibly be implemented for that purpose. Moreover, some standard algorithms suitable to fulfill this function are available either on the market or from the open literature.

Note that comparison of the waveforms of signals r1 and a1 performed by the two-channel receiver 43 of FIG. 4 produces a more accurate comparison signal 56 than detection of a power level as performed by the combiner 40 and diode detector 41 of FIG. 3. This therefore also enables the controller 32 to more accurately control the attenuator 25 and phase shifter 26.

Another embodiment of the invention deals with the problem of keeping the complex gain of the second loop constant with respect to slight variations with temperature. This is achieved by equalization of the delay lines (28 and 39) in the adaptive linearization circuit.

In order to grasp this concept, delays in the adaptive linearization circuit must be defined. Therefore:

D0=delay induced by delay line 28

D1=delay induced by directional coupler 37;

D2=delay induced by combiner 14 and directional coupler 22;

D3=delay induced by modulator 25 and error amplifier 3;

D4=delay induced by directional coupler 38; and

D5=delay induced by delay line 39; and

D6=delay induced by the transmission line connecting directional coupler 38 to combiner 40 in FIG. 3, or the transmission line connecting the directional coupler 38 to the receiver 43 in FIG. 4.

By selecting the delay line 39 (D5) to be the same (length, type, etc.) as the delay line 28 (D0) and equalizing the delays in both feedforward second loop and CGS loop as follows:

D0=D1+D2+D3+D4

D5=D1+D3+D6

This automatically will enforce that D6=D2+D4.

Normally, any insertion loss or phase variations with temperature of the delay line 28 (D0) will induce a perturbation on the balance of the second loop of the feedforward amplifier. To re-balance this loop, its low path parameters must be adjusted in amplitude and phase. By equalizing the delays as mentioned above the CGS system intrinsically becomes as an automatic tracking and self-adjustment mechanisms to keep the second loop always balanced independently of the state of the delay line 28.

Although the present invention has been described hereinabove by way of a preferred embodiment thereof, this embodiment can be modified at will, within the scope of the appended claims, without departing from the spirit and nature of the subject invention.

What is claimed is:

1. An adaptive linearization circuit for a feedforward power amplifier which, in operation, supplies an amplified output signal on a feedforward amplifier output and produces an error signal representative of distortion in the amplified output signal, said adaptive linearization circuit comprising:
    a controllable signal feature-adjusting circuit having an input responsive to the error signal and a feature-adjusted error signal delivering output; and
    a comparator/controller circuit having a first input responsive to the error signal, a second input responsive to the feature-adjusted error signal, and a control output connected to the controllable signal feature-adjusting circuit so that, in operation, the signal feature-adjusting circuit is controlled in relation to a comparison between the error signal and the feature-adjusted error signal;
    whereby, in operation, the controllable signal feature-adjusting circuit supplies a feature-adjusted error signal which, when combined with the amplified output signal, substantially cancels distortion in said amplified output signal.

2. An adaptive linearization circuit as defined in claim 1, further comprising a coupling member between the output of the signal feature-adjusting circuit and the feedforward amplifier output, wherein, in operation, the coupling member combines the feature-adjusted error signal with the amplified output signal.

3. An adaptive linearization circuit as recited in claim 1, wherein the controllable signal feature-adjusting circuit comprises:
    a controllable amplitude and phase modulator including:
        an amplitude attenuator to adjust an amplitude of the error signal; and
        a phase shifter to adjust a phase of said error signal; and
    an error amplifier responsive to the amplitude and phase adjusted error signal, wherein, in operation, the error amplifier amplifies the amplitude and phase adjusted error signal and thereby produces an amplified error signal constituting said feature-adjusted error signal.

4. An adaptive linearization circuit as recited in claim 3, wherein the comparator/controller circuit comprises:
    a signal comparator sub-circuit having the first input responsive to the error signal, the second input responsive to the amplified error signal, and a comparison representative signal delivering output, wherein said comparison representative signal is representative of a comparison between the error signal and the amplified error signal; and
    a controller responsive to the comparison representative signal and having a first attenuator control output connected to the amplitude attenuator and a second phase shifter control output connected to the phase shifter.

5. An adaptive linearization circuit as recited in claim 4, wherein the signal comparator sub-circuit comprises a complex gain stabilization circuit.

6. An adaptive linearization circuit as recited in claim 1, wherein the comparator/controller circuit comprises:
    a signal comparator sub-circuit having the first input responsive to the error signal, the second input responsive to the feature-adjusted error signal, and a comparison representative signal delivering output, wherein the comparison representative signal is representative of a comparison between the error signal and the feature-adjusted error signal; and
    a controller responsive to the comparison representative signal and having a control output connected to the signal feature-adjusting circuit.

7. An adaptive linearization circuit as recited in claim 1, wherein the controllable signal feature-adjusting circuit comprises:
    a controllable amplitude and phase modulator which, in operation, is supplied with the error signal and adjusts an amplitude and a phase of said error signal; and
    an error amplifier responsive to the amplitude and phase adjusted error signal and having an amplified error signal delivering output, wherein, in operation, the error amplifier amplifies the amplitude and phase adjusted error signal and thereby produces said amplified error signal, said amplified error signal constituting the feature-adjusted error signal.

8. An adaptive linearization circuit as recited in claim 7, wherein the comparator/controller circuit comprises:
    a 180° out of phase error signal and amplified error signal combiner having a first input coupled to the error signal, a second input coupled to the amplified error signal, and a combination signal delivering output, wherein, in operation, the combiner combines the error signal and the amplified error signal 180° out of phase with respect to each other and thereby produces the combination signal;
    a power detector responsive to said combination signal from the combiner, and having a combination signal power level delivering output; and
    a controller of the amplitude and phase modulator, including a combination signal power level minimizing algorithm responsive to the power level from the output of the power detector.

9. An adaptive linearization circuit as recited in claim 8, further comprising:
    a delay circuit connected to the first input of the signal combiner, wherein, in operation, the error signal is transmitted to the first input of the signal combiner through said delay circuit to compensate for a time of propagation of the error signal through the controllable amplitude and phase modulator and the error amplifier.

10. An adaptive linearization circuit as recited in claim 7, wherein the comparator/controller circuit comprises:
    a waveform comparing receiver having a first input coupled to the error signal, a second input coupled to the amplified error signal, and a waveform comparison signal delivering output, said waveform comparison signal being representative of a comparison between a waveform of the error signal and a waveform of the amplified error signal; and
    a controller of the amplitude and phase modulator, including an algorithm of control of the amplitude and phase modulator and of the corresponding adjustment of the amplitude and phase of the error signal, said algorithm being responsive to the waveform comparison signal and structured to keep substantially constant a complex ratio between the error signal on the first input of the waveform comparing receiver and the amplified error signal on the second input of the waveform comparing receiver.

11. An adaptive linearization circuit as recited in claim 10, further comprising:
a delay circuit connected to the first input of the waveform comparing receiver, wherein, in operation, the error signal is transmitted to the first input of the waveform comparing receiver through said delay circuit to compensate for a time of propagation of the error signal through the controllable amplitude and phase modulator and the error amplifier.

12. A feedforward amplifier for amplifying an input signal in order to produce an amplified signal, comprising:
a main amplifier circuit having an input responsive to the input signal and an amplified signal delivering output connected to feedforward amplifier output;
a signal-comparing circuit having a first input responsive to the input signal, a second input responsive to the amplified signal on the output of the main amplifier circuit, and an error signal delivering output, said error signal being representative of a comparison between the input signal and the amplified signal and of distortion in the amplified signal;
an adaptive linearization circuit comprising:
a controllable signal feature-adjusting circuit having an input responsive to the error signal and a feature-adjusted error signal delivering output; and
a comparator/controller circuit having a first input responsive to the error signal, a second input responsive to the feature-adjusted error signal, and a control output connected to the controllable signal feature-adjusting circuit so that, in operation, the signal feature-adjusting circuit is controlled in relation to a comparison between the error signal and the feature-adjusted error signal; and
a coupling member between the output of the signal feature-adjusting circuit and the feedforward amplifier output, wherein, in operation, the coupling member combines the feature-adjusted error signal with the amplified signal in order to substantially cancel distortion in the amplified output signal.

13. A feedforward amplifier as recited in claim 12, wherein the comparator/controller circuit comprises:
a signal comparator sub-circuit having the first input responsive to the error signal, the second input responsive to the feature-adjusted error signal, and a comparison representative signal delivering output, wherein said comparison representative signal is representative of a comparison between the error signal and the feature-adjusted error signal; and
a controller of the signal feature-adjusting circuit responsive to the comparison representative signal.

14. A feedforward amplifier as recited in claim 12, wherein the signal comparing circuit comprises:
a 180° out of phase input signal and amplified signal combiner having a first input coupled to the input signal, a second input coupled to the amplified signal, and an error signal delivering output, wherein, in operation, said combiner combines said input signal and amplified signal 180° out of phase with respect to each other and thereby produces the error signal.

15. A feedforward amplifier as recited in claim 14, further comprising:
a delay circuit connected to the first input of the combiner, wherein, in operation, the input signal is transmitted to the first input of the combiner through the delay circuit to compensate for a time of propagation of the input signal through the main amplifier circuit.

16. A feedforward amplifier as recited in claim 12, wherein the signal feature-adjusting circuit comprises:
a controllable amplitude and phase modulator including:
an amplitude attenuator to adjust an amplitude of the error signal; and
a phase shifter to adjust a phase of said error signal; and
an error amplifier responsive to the amplitude and phase adjusted error signal, wherein, in operation, the error amplifier amplifies the amplitude and phase adjusted error signal and thereby produces an amplified error signal constituting said feature-adjusted error signal.

17. A feedforward amplifier as recited in claim 16, wherein the comparator/controller circuit comprises:
a signal comparator sub-circuit having the first input responsive to the error signal, the second input responsive to the feature-adjusted error signal, and a comparison representative signal delivering output, wherein the comparison representative signal is representative of a comparison between the error signal and the feature-adjusted error signal; and
a controller responsive to the output comparison signal and having a control output connected to the signal feature-adjusting circuit.

18. A feedforward amplifier as recited in claim 17, wherein a time of propagation of the error signal through the controllable amplitude and phase modulator and the error amplifier varies non-linearly with a condition of operation of the feedforward amplifier, said feedforward amplifier further comprising:
a first delay circuit through which, in operation, the error signal is transmitted to the first input of the signal comparator sub-circuit to compensate for a time of propagation of the error signal through the controllable amplitude and phase modulator and the error amplifier;
a second delay circuit between the output of the main amplifier circuit and the coupling member, wherein, in operation, the amplified signal is transmitted from the output of the main amplifier circuit to the coupling member to compensate a time of propagation of the error signal through a signal loop comprising the signal-comparing circuit, the controllable signal feature-adjusting circuit and the coupling member;
wherein the respective delays induced by said first and second delay circuits are substantially equal resulting in independence of said adaptive linearization circuit from said non-linear variation.

19. A feedforward amplifier as recited in claim 18, wherein said condition of operation comprises temperature.

20. A feedforward amplifier as recited in claim 12, wherein the signal feature-adjusting circuit comprises:
a controllable amplitude and phase modulator which, in operation, adjusts an amplitude and a phase of the error signal; and
an error amplifier responsive to the amplitude and phase adjusted error signal and having an amplified error signal delivering output, wherein in operation, the error amplifier amplifies the amplitude and phase adjusted error signal and thereby produces the amplified error signal, said amplified error signal constituting the feature-adjusted error signal.

21. A feedforward amplifier as recited in claim 20, wherein the comparator/controller circuit comprises:
    a 180° out of phase error signal and amplified error signal combiner having a first input coupled to the error signal, a second input coupled to the amplified error signal, and a combination signal delivering output, wherein, in operation, said combiner combines the error signal and the amplified error signal 180° out of phase with respect to each other and thereby produces the combination signal;
    a power detector responsive to said combination signal from the combiner, and having a combination signal power level delivering output; and
    a controller of the amplitude and phase modulator, including a combination signal power level minimizing algorithm responsive to the power level from the output of the power detector.

22. A feedforward amplifier as recited in claim 21, further comprising:
    a delay circuit connected to the first input of the combiner, wherein in operation, the error signal is transmitted to the first input of the combiner through said delay circuit to compensate for a time of propagation of the error signal through the controllable amplitude and phase modulator and the error amplifier.

23. A feedforward amplifier as recited in claim 20, wherein the comparator/controller circuit comprises:
    a waveform comparing receiver having a first input coupled to the error signal, a second input coupled to the amplified error signal, and a waveform comparison signal delivering output, said waveform comparison signal being representative of a comparison between a waveform of the error signal and a waveform of the amplified error signal; and
    a controller of the amplitude and phase modulator, including an algorithm of control of the amplitude and phase modulator and of the corresponding adjustment of the amplitude and phase of the error signal, said algorithm being responsive to the waveform comparison signal and structured to keep substantially constant a complex ratio between the error signal on the first input of the waveform comparing receiver and the amplified error signal on the second input of the waveform comparing receiver.

24. A feedforward amplifier as recited in claim 23, further comprising:
    a delay circuit connected to the first input of the waveform comparing receiver, wherein in operation, the error signal is transmitted to the first input of the waveform comparing receiver through said delay circuit to compensate for a time of propagation of the error signal through the controllable amplitude and phase modulator and the error amplifier.

25. A method for adaptively linearizing a feedforward amplifier which, in operation, supplies an amplified output signal on a feedforward amplifier output and produces an error signal representative of distortion in the amplified output signal, said adaptive linearization method comprising:
    controllably adjusting at least one feature of the error signal; and
    controlling the error signal feature adjusting in relation to the error signal and the feature-adjusted error signal;
    whereby the feature-adjusted error signal, when combined with the amplified output signal, substantially cancels distortion in said amplified output signal.

26. A method as recited in claim 25, further comprising combining the feature-adjusted error signal and the amplified output signal.

27. A method as recited in claim 25, wherein the error signal feature adjusting comprises:
    attenuating an amplitude of the error signal;
    shifting a phase of the error signal; and
    amplifying the amplitude-attenuated and phase-shifted error signal and producing a corresponding amplified error signal constituting said feature-adjusted error signal.

28. A method as recited in claim 25, wherein controlling of the error signal feature adjustment comprises:
    comparing the error signal and the feature-adjusted error signal and producing a corresponding output comparison signal; and
    controlling the error signal feature adjusting in response to the output comparison signal.

29. A method as recited in claim 27, wherein controlling of the error signal feature adjusting comprises:
    combining the error signal and the amplified error signal 180° out of phase with respect to each other and producing a corresponding output combination signal;
    detecting the power level of the output combination signal and producing a corresponding output power level signal; and
    controlling the error signal amplitude attenuating and the error signal phase shifting and thereby adjusting the amplitude and phase of the error signal in view of minimizing the output power level signal.

30. A method as recited in claim 27, wherein controlling of the error signal feature adjusting comprises:
    comparing waveforms of the error signal and the amplified error signal and producing an output waveform comparison signal; and
    controlling the error signal amplitude attenuating and the error signal phase shifting and thereby adjusting the amplitude and phase of the error signal in view of keeping a complex ratio between the error signal and the amplified error signal substantially constant.

31. An adaptive linearization circuit for a feedforward power amplifier which, in operation, supplies an amplified output signal on a feedforward amplifier output and produces an error signal representative of distortion in the amplified output signal, said adaptive linearization circuit comprising:
    a controllable signal feature-adjusting circuit responsive to the error signal for producing a feature-adjusted error signal; and
    a comparator/controller circuit for comparing the error signal and the feature-adjusted error signal, and for controlling the signal feature-adjusting circuit in relation to the comparison between the error signal and the feature-adjusted error signal;
    whereby, in operation, the controllable signal feature-adjusting circuit supplies a feature-adjusted error signal which, when combined with the amplified output signal, substantially cancels distortion in said amplified output signal.

32. A feedforward amplifier for amplifying an input signal in order to produce an amplified output signal, comprising:
- a main amplifier circuit responsive to the input signal for producing the amplified output signal supplied on a feedforward amplifier output;
- a signal comparator circuit responsive to the input signal and the amplified output signal for comparing the input signal and the amplified output signal and, as a result of said comparison, supplying an error signal representative of distortion in the amplified output signal;
- an adaptive linearization circuit comprising:
  - a controllable signal feature-adjusting circuit responsive to the error signal for producing a feature-adjusted error signal; and
  - a comparator/controller circuit for comparing the error signal and the feature-adjusted error signal, and for controlling the signal feature-adjusting circuit in relation to the comparison between the error signal and the feature-adjusted error signal; and
- a coupling member for transmitting the feature-adjusted error signal to the feedforward amplifier output in order to combine the feature-adjusted error signal and the amplified output signal in order to substantially cancel distortion in the amplified output signal.

33. An adaptive linearization circuit as recited in claim 8, further comprising a multiplier of the amplified error signal by a constant, connected between the output of the error amplifier and the second input of the combiner.

34. A feedforward amplifier as recited in claim 21, further comprising a multiplier of the amplified error signal by a constant, connected between the output of the error amplifier and the second input of the combiner.

\* \* \* \* \*